US012262693B1

(12) United States Patent
Feng et al.

(10) Patent No.: US 12,262,693 B1
(45) Date of Patent: Apr. 1, 2025

(54) BARKING CONTROL DEVICE

(71) Applicant: Shenzhen SmartPet Technology Co., Ltd., Guangdo (CN)

(72) Inventors: Wenjin Feng, Guangdong (CN); Junyong Zhang, Guangdong (CN)

( * ) Notice: Subject to any disclaimer, the term of this patent is extended or adjusted under 35 U.S.C. 154(b) by 0 days.

(21) Appl. No.: 18/671,344

(22) Filed: May 22, 2024

Related U.S. Application Data

(63) Continuation of application No. 18/398,618, filed on Dec. 28, 2023.

(30) Foreign Application Priority Data

May 16, 2024 (CN) .......................... 202421067654.1

(51) Int. Cl.
*A01K 15/02* (2006.01)
*G02F 1/1335* (2006.01)
*H05K 1/14* (2006.01)
*H05K 1/18* (2006.01)

(52) U.S. Cl.
CPC ...... *A01K 15/022* (2013.01); *G02F 1/133524* (2013.01); *G02F 1/133526* (2013.01); *H05K 1/14* (2013.01); *H05K 1/18* (2013.01); *H05K 2201/10136* (2013.01)

(58) Field of Classification Search
CPC .. A01K 15/022; A01K 15/023; A01K 15/029; G02F 1/133524; G02F 1/133526; H05K 1/14; H05K 1/18; H05K 2201/10136
See application file for complete search history.

(56) References Cited

U.S. PATENT DOCUMENTS

| | | | | |
|---|---|---|---|---|
| 5,749,324 | A * | 5/1998 | Moore | A01K 27/009 119/718 |
| 7,434,541 | B2 * | 10/2008 | Kates | A01K 15/02 119/908 |
| 10,834,897 | B1 * | 11/2020 | Chen | A01K 11/008 |
| 12,048,290 | B1 * | 7/2024 | Feng | A01K 15/022 |
| 12,048,291 | B1 * | 7/2024 | Feng | A01K 15/022 |

(Continued)

FOREIGN PATENT DOCUMENTS

| | | | |
|---|---|---|---|
| CN | 208387591 U | * | 1/2019 |
| CN | 212697173 U | * | 3/2021 |

(Continued)

*Primary Examiner* — Ebony E Evans

(57) ABSTRACT

A barking control device includes a dog training module, a pickup module and a control module. The pickup module and the dog training module are both electrically connected to the control module. The dog training module is driven by the control module to output stimuli to a target dog. The control module stores barking control audio data. The control module obtains a voice of a user through the pickup module and matches the voice with the barking control audio data. When the voice is consistent with the barking control audio data, the control module drives the dog training module. So that when the target dog does something wrong and is going to be punished, a user may directly speak. The pickup module picks up the voice and transmits it to the control module. The control module processes the voice and matches it with the barking control audio data.

18 Claims, 7 Drawing Sheets

(56) References Cited

U.S. PATENT DOCUMENTS

| | | | | |
|---|---|---|---|---|
| 2007/0095303 A1* | 5/2007 | Lee, IV | ............... | A01K 15/022 |
| | | | | 119/718 |
| 2011/0061605 A1* | 3/2011 | Hardi | ................... | A01K 27/009 |
| | | | | 340/573.3 |
| 2016/0021506 A1* | 1/2016 | Bonge, Jr. | .............. | G16H 40/67 |
| | | | | 717/173 |
| 2017/0223928 A1* | 8/2017 | Davino | ................. | H04N 7/155 |
| 2018/0249680 A1* | 9/2018 | Van Curen | ........... | A01K 15/022 |
| 2020/0390063 A1* | 12/2020 | Li | ........................ | A01K 27/009 |
| 2021/0219524 A1* | 7/2021 | So | ............................ | H04R 1/08 |

FOREIGN PATENT DOCUMENTS

| | | | | |
|---|---|---|---|---|
| KR | 20150080999 A | * | 7/2015 | ........... A01K 15/022 |
| WO | WO-2011082208 A2 | * | 7/2011 | ........... A01K 15/023 |

* cited by examiner

BARKING CONTROL DEVICE

CROSS REFERENCE TO RELATED APPLICATION

This application is a continuation of U.S. application Ser. No. 18/398,618, entitled "BARK CONTROL DEVICE," filed Dec. 28, 2023, claimed priority benefit of Chinese patent Application No. 202421067654.1, filed on May 16, 2024, and the entire contents of which are incorporated herein by reference.

TECHNICAL FIELD

The present disclosure relates to the technical field of target dog supplies, and in particular, to a barking control device.

BACKGROUND

As is well known, a barking control device is a product that uses ultrasonic waves, vibrations, electric shocks, and other forms to punish dogs and make them barking control. At present, an existing barking control device is worn on the body of a target dog. When an owner hears the dog bark or make noise, the owner usually remotely controls the barking control device through a remote controller, sends an instruction to the barking control device, and uses the barking control device to stimulate the target dog to achieve punishment. This operation mode is cumbersome. When the target dog does something wrong, the user needs to first find the remote controller, and then presses a button on the remote controller to stimulate the target dog.

SUMMARY

The present disclosure mainly aims to provide a barking control device to solve the problem that it is cumbersome for the existing barking control device to achieve stimulation through an instruction sent by a remote controller.

In order to solve the technical problem, the technical scheme provided by the present disclosure is as follows.

A barking control device, includes:
 a dog training module configured to output stimuli to a target dog;
 a pickup module configured to pick up a sound; and
 a control module electrically connected to the pickup module and the dog training module,
 wherein the control module stores barking control audio data; the control module obtains a voice through the pickup module and matches the voice with the barking control audio data; and when the voice obtained by the pickup module is consistent with the barking control audio data, the control module drives the dog training module.

As a preferred embodiment, one piece of barking control audio data is stored.

As a preferred embodiment, when various pieces of barking control audio data are stored, the control module drives the dog training module when the voice is consistent with one piece of barking control audio data.

As a preferred embodiment, the control module is further configured to store the voice transmitted by the pickup module and use the voice as barking control audio data.

As a preferred embodiment, the pickup module is further configured to capture a voice of the target dog, and the control module further stores pet audio data; the control module is further configured to match the voice transmitted by the pickup module with the pet audio data; and when the voice transmitted by the pickup module is determined to be the pet audio data, the control module drives the dog training module.

As a preferred embodiment, the barking control device further includes a motion sensing unit, wherein the motion sensing unit is configured to obtain a motion signal of the target dog; and the control module is further configured to receive the motion signal of the target dog and drive the dog training module according to the motion signal of the target dog and when it is determined that the voice is the pet audio data.

As a preferred embodiment, the barking control device includes a main body, a display module, a battery, and a first circuit board; the first circuit board, the pickup module, and the dog training module are all arranged on the main body; the control module is arranged on the first circuit board; the control module is further electrically connected to the display module and the battery; the display module is configured to achieve displaying in one or more situations when the barking control device is turned on, when the dog training module outputs stimuli to the target dog, or when the pickup module picks up a voice; a window is formed in a position, corresponding to the display module, on a surface of the main body; and the display module corresponds to the position of the window.

As a preferred embodiment, the display module includes a second circuit board, a backlight board, and a liquid crystal display screen which are arranged in the main body; the backlight board and the liquid crystal display screen are both welded to one side of the second circuit board close to the window; the control module is electrically connected to the second circuit board; the first circuit board is located on one side of the second circuit board away from the display module; and the liquid crystal display screen is located on one side of the backlight board away from the first circuit board.

As a preferred embodiment, the display module includes a second circuit board, a light guide plate, and a pattern substrate arranged in the main body; at least a portion of the light guide plate is arranged in the window; the pattern substrate is pasted on one side of the light guide plate close to the window; the second circuit board is arranged on one side of the light guide plate away from the window; the pattern substrate is provided with a light-transmittance pattern configured to transmit light; the light guide plate is provided with a through hole at a position corresponding to the light-transmittance pattern; the second circuit board is provided with a light source assembly at a position corresponding to the through hole; and after light from the light source assembly passes through the through hole and the light-transmittance pattern in sequence, the light-transmittance pattern is mapped out from a lens.

As a preferred embodiment, the light-transmittance pattern includes a power indicator pattern configured to transmit light and a battery level pattern located next to the power indicator pattern to transmitting light; the through hole includes a first hole corresponding to the position of the power indicator pattern and a second hole corresponding to the position of the battery level pattern; and the light source assembly includes a first light-emitting body corresponding to the position of the first hole and a second light-emitting body corresponding to the position of the second hole.

As a preferred embodiment, the light-transmittance pattern includes a vibration indicator pattern configured to transmit light; the through hole includes a third hole corresponding to the position of the vibration indicator pattern; the light source assembly includes a third light-emitting body corresponding to the position of the third hole; and the vibration indicator pattern is circular, with an opaque dot in the middle and a plurality of opaque curved parts located next to the dot.

As a preferred embodiment, the light-transmittance pattern includes an electric shock indicator pattern configured to transmit light; the through hole includes a fourth hole corresponding to the position of the electric shock indicator pattern; the light source assembly includes a fourth light-emitting body corresponding to the position of the fourth hole; and the electric shock indicator pattern is circular and is provided with an opaque slash part and broken line parts located on two sides of the slash part.

As a preferred embodiment, the light-transmittance pattern includes an "8"-shaped digital pattern configured to display a vibration gear; the through hole includes a fifth hole corresponding to the position of the digital pattern; and the light source assembly includes a fifth light-emitting body corresponding to the position of the fifth hole.

As a preferred embodiment, the main body includes a surface shell and a bottom shell connected to the surface shell; the window is located on the surface shell; the display module is fixed on the surface shell; the dog training module includes an electric shock component electrically connected to the control module; the electric shock component is located on one side of the first circuit board away from the second circuit board; and at least a portion of the electric shock component extends out to an outer side of the main body.

As a preferred embodiment, the electric shock component includes a conductive spring welded on the circuit board, a conductive element resisting against the conductive spring, and an electric shock part connected to the conductive element; one end of the conductive element extends from the inside of the main body and is placed on the outer side of the main body; the conductive element is integrally formed with the main body by injection molding; and the electric shock part is located on the outer side of the main body.

As a preferred embodiment, the dog training module includes a speaker; the speaker is located on one side of the first circuit board away from the second circuit board; several voice outlet holes are formed in a position, corresponding to the speaker, on an outer side of the main body; a second enclosure wall with a first mounting slot is formed at a position, corresponding to the speaker, in the main body; and the speaker is fixed in the first mounting slot in a gluing manner.

As a preferred embodiment, the dog training module includes a vibration motor electrically connected to the first circuit board; the vibration motor is arranged in the main body; and the vibration motor is located between the second circuit board and the first circuit board.

As a preferred embodiment, the battery is located between the second circuit board and the first circuit board; the second circuit board is provided with a first connector on one side close to the first circuit board; the first circuit board is provided with a second connector on one side close to the second circuit board; the first connector is connected to the second connector; and the first connector is located next to the battery.

As a preferred embodiment, the battery is located between the second circuit board and the first circuit board; the second circuit board is provided with a first connector on one side close to the first circuit board; the first circuit board is provided with a second connector on one side close to the second circuit board; the first connector is connected to the second connector; and the first connector is located next to the battery.

As a preferred embodiment, the first circuit board is provided with a function button on one side away from the second circuit board; the main body is provided with a pressing member at a position corresponding to the function button; one end of the pressing member resists against the function button, and the other end extends out to an outer side of the main body; the pressing member is fixed to the main body in a gluing manner on one side close to the window; the function button includes a first switch arranged on the first circuit board and configured for turning on and turning off, and a second switch configured to switch modes; the control module is electrically connected to the first switch and the second switch, respectively; and the control module is configured to receive a signal of the second switch and switch modes of the dog training module according to a feedback signal.

The present disclosure has the beneficial effects: Compared with the prior art, in this embodiment, the pickup module configured to pick up a voice is configured on the barking control device, so that when the target dog does something wrong and is going to be punished, a user may directly speak. The pickup module picks up the voice and transmits it to the control module. The control module processes the voice and matches it with the barking control audio data. When the voice is consistent with the barking control audio data, the control module drives the dog training module to provide stimuli to the target dog to achieve punishment and control the voice, so that the user does not need to carry a remote controller in real time. When the target dog does something wrong, the user can stop the dog in a timely manner. It is convenient for the user to operate this device.

BRIEF DESCRIPTION OF THE DRAWINGS

In order to explain the technical solutions of the embodiments of the present disclosure more clearly, the following will briefly introduce the accompanying drawings used in the embodiments. Apparently, the drawings in the following description are only some embodiments of the present disclosure. Those of ordinary skill in the art can obtain other drawings based on these drawings without creative work.

DETAILED DESCRIPTION OF THE EMBODIMENTS

Figure 1:
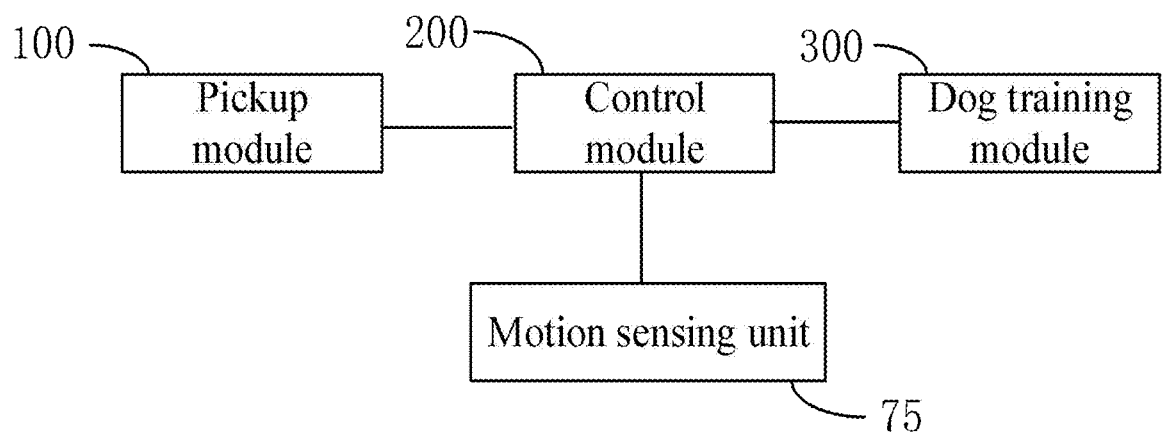
FIG. 1 is a schematic block diagram of an embodiment of the present disclosure.
Figure 2:
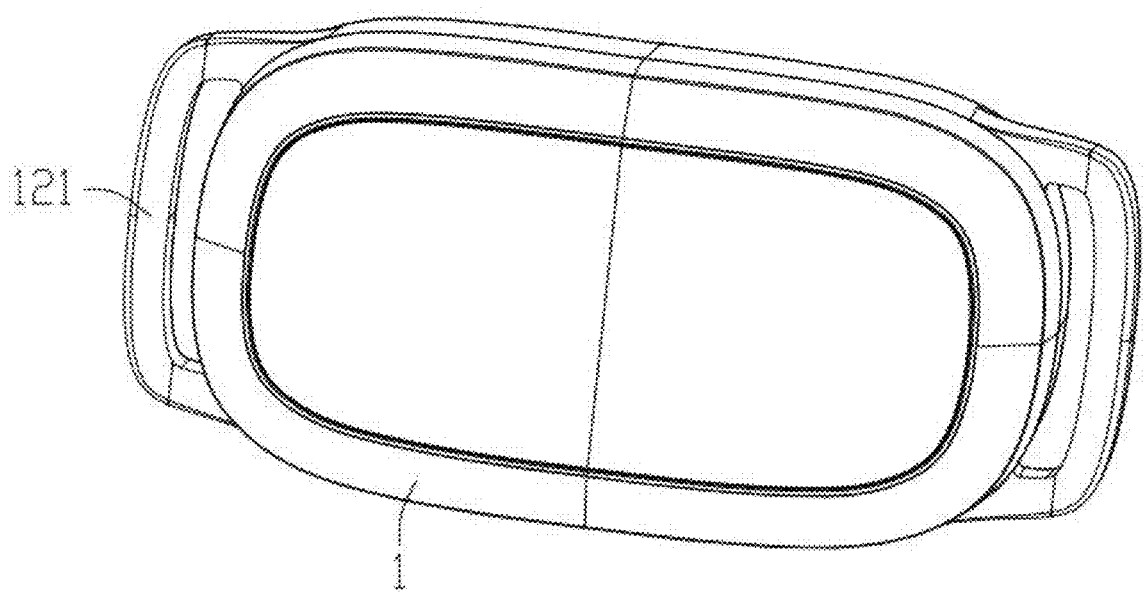
FIG. 2 is a three-dimensional diagram of an embodiment of the present disclosure.
Figure 3:
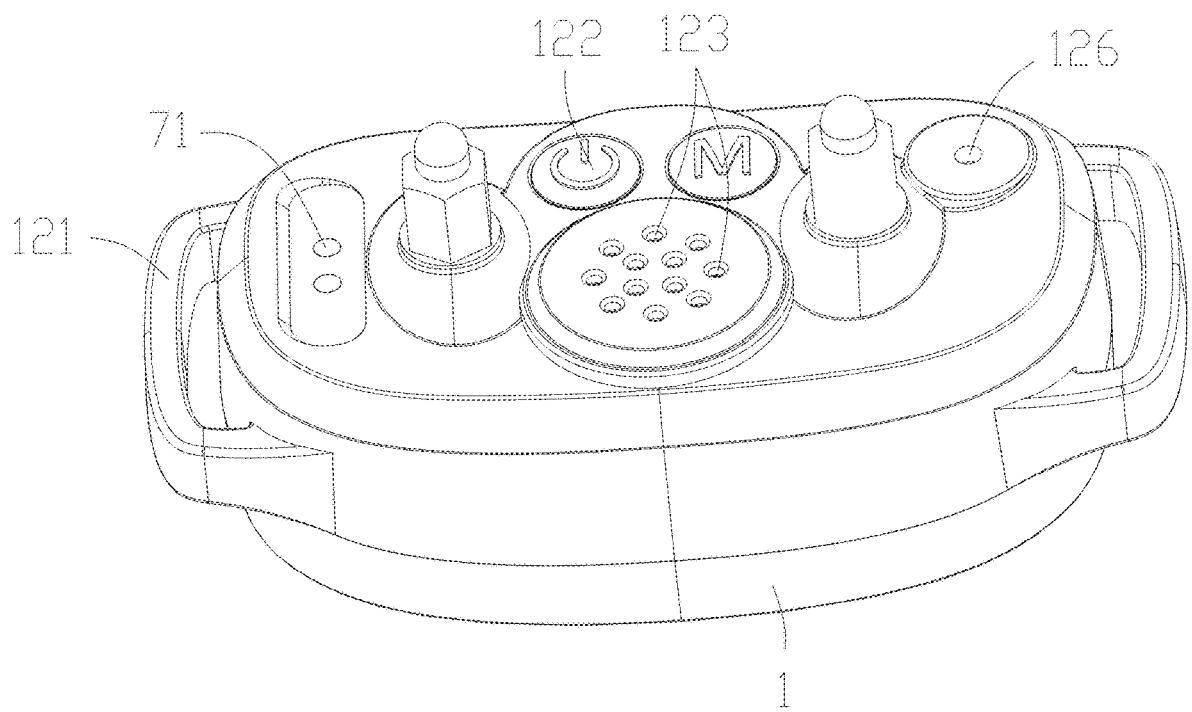
FIG. 3 is a three-dimensional diagram in another viewing angle according to an embodiment of the present disclosure.

The accompanying drawings in the embodiment of the present disclosure are combined, The technical scheme in the embodiment of the present disclosure is clearly and completely described, Obviously, the described embodiment is only a part of the embodiment of the present disclosure, but not all embodiments are based on the embodiment of the present disclosure, and all other embodiments obtained by ordinary technicians in the field on the premise of not doing creative work belong to the protection range of the present disclosure.

Referring to FIG. 1 to FIG. 10, a barking control device in an embodiment of the present disclosure is shown.

The barking control device includes a dog training module 300, a pickup module 100, and a control module 200. The pickup module 100 and the dog training module 300 are both electrically connected to the control module 200. The dog training module 300 is driven by the control module 200 to output stimuli to a target dog; the pickup module 100 is configured to pick up a voice; and the control module 200 stores barking control audio data. The control module 200 obtains a voice of a user through the pickup module 100 and matches the voice with the barking control audio data; and when the voice is consistent with the barking control audio data, the control module 200 drives the dog training module 300.

In this embodiment, the pickup module 100 configured to pick up a voice is configured on the barking control device, so that when the target dog does something wrong and is going to be punished, a user may directly speak. The pickup module 100 picks up the voice and transmits it to the control module 200. The control module 200 processes the voice and matches it with the barking control audio data. When the voice is consistent with the barking control audio data, the control module 200 drives the dog training module 300 to provide stimuli to the target dog to achieve punishment and control the voice, so that the user does not need to carry a remote controller in real time. When the target dog does something wrong, the user can stop the dog in a timely manner. It is convenient for the user to operate this device.

In an embodiment, one piece of barking control audio data is stored. To be specific, when a user says the same words as the barking control audio data, the control module 200 drives the dog training module 300 to punish the target dog.

In an embodiment, when various pieces of barking control audio data are stored, the control module 200 may drive the dog training module 300 when the voice is consistent with one piece of barking control audio data. For example, the barking control audio data includes Bad dog, Don't run, Don't fight, and the like. When the target dog bites shoes or is disruptive at home, the barking control audio data is "Bad dog". If a user says "Bad dog", the control module 200 drives the dog training module 300. When a user walks the target dog and the target dog, if the user says "Stop it now", the control module 200 recognizes "Don't run" and drives the training module 300 to punish the target dog. Punishing the target dog when a "Don't" command issued by a user corresponds to a behavior of the target dog can effectively train the behavior of the target dog and help the target dog understand which behaviors are not acceptable.

In an embodiment, the control module 200 is further configured to store the voice transmitted by the pickup module 100 and use the voice as barking control audio data. Namely, a user can customize an audio as barking control audio data to meet the needs of different users for different keywords in the barking control audio data, and can make personalized settings. For example, a user can use words such as "Don't bite shoes" and "Don't play with water" as barking control audio data. When the user says the words such as "Don't bite shoes" and "Don't play with water", the dog training module 300 provides the stimuli to the target dog and punishes the target dog.

In an embodiment, the barking control device further includes a motion sensing unit 75. The motion sensing unit 75 is configured to obtain a motion signal of the target dog. The control module 200 is further configured to receive the motion signal of the target dog and drive the dog training module 300 according to the motion signal of the target dog and when it is determined that the voice is the barking control audio data.

In practical use, namely, when the barking control device is fixed to the neck of the target dog through a collar, the motion sensing unit 75 abuts against the position of the prominentia laryngea of the target dog. When the target dog moves, the motion sensing unit 75 can detect the motion of the prominentia laryngea of the target dog, thereby feeding back an electrical signal to the control module 200. When the electrical signal received by the control module 200 is consistent with pet audio data, the control module 200 drives the dog training module 300 to work, so as to prevent such a phenomenon that one of many target dogs does something wrong, but all the target dogs are punished. The punishment accuracy is improved. Specifically, the motion sensing unit 75 may be an accelerometer, a gyroscope, and the like.

In the above barking control device, the barking control device includes a main body 1, a display module 10, a battery 5, and a first circuit board 7. The first circuit board 7, the pickup module 100, and the dog training module 300 are all arranged on the main body 1, and the control module 200 is arranged on the first circuit board 7. The control module 200 is further electrically connected to the display module 10 and the battery 5. The display module 10 is configured to achieve displaying in one or more situations when the barking control device is turned on, when the dog training module 300 outputs stimuli to the target dog, or when the pickup module 100 picks up a voice, so that a user can learn about a working state of the barking control device through content displayed by the display module 10, to prevent the impact on the punishment on the target dog because the barking control device does not work.

A window 113 is formed at a position, corresponding to the display module 10, on one surface of the main body 1, and the display module 10 corresponds to the position of the window 113. Specifically, when the barking control device is worn on the neck of the target dog, the display module 10 is located on one side of the barking control device away from the neck of the target dog, so that a user can observe the display module 10.

In an embodiment, the display module 10 includes a second circuit board 4a, a backlight board 3, and a liquid crystal display screen 2 which are arranged in the main body 1. The backlight board 3 and the liquid crystal display screen 2 are both welded to one side of the second circuit board 4a close to the window 113 to fix the backlight board 3 and the liquid crystal display screen 2. The control module 200 is electrically connected to the second circuit board 4a. The first circuit board 7 is located on one side of the second circuit board 4a away from the display module 10, and the liquid crystal display screen 2 is located on one side of the backlight board 3 away from the first circuit board 7. The backlight board 3 is configured to provide backlight to the liquid crystal display screen 2 for a user to observe displayed content of the liquid crystal display screen 2.

In an embodiment, the main body 1 includes a surface shell 11 and a bottom shell 12 connected to the surface shell 11 through ultrasonic waves to achieve sealing between the bottom shell 12 and the surface shell 11 and play a waterproof role. Specifically, the window 113 is located on the surface shell 11, and the display module 10 is fixed on the surface shell 11. Of course, in other embodiments, the bottom shell 12 and the surface shell 11 may be fixed with screws and glue to achieve a sealing effect.

In practical application, fixing lugs 121 for fixing the collar are arranged on two sides of the surface shell 11 or the bottom shell 12. After the fixing lugs 121 are connected to the collar of the target dog, the barking control device in this embodiment may be mounted on the neck or body of the target dog through the collar. When the target dog barks, a user can speak to drive the dog training module 300 to work, playing a punishment role for the target dog. The frightened target dog may stop barking. This plays a barking control role.

In an embodiment, the pickup module 100 is preferably a microphone 126. To be specific, when the target dog barks, the microphone 126 picks up a voice of a user, and the control module 200 drives the dog training module 300 to work.

In an embodiment, the dog training module 300 includes an electric shock component 6 electrically connected to the control module 200; the electric shock component 6 is located on one side of the first circuit board 7 away from the second circuit board 4a; and at least a portion of the electric shock component 6 extends out to an outer side of the main body 1. Thus, the control module 200 outputs a voltage to the electric shock component 6, which can achieve an effect of punishing the target dog.

Figure 5:
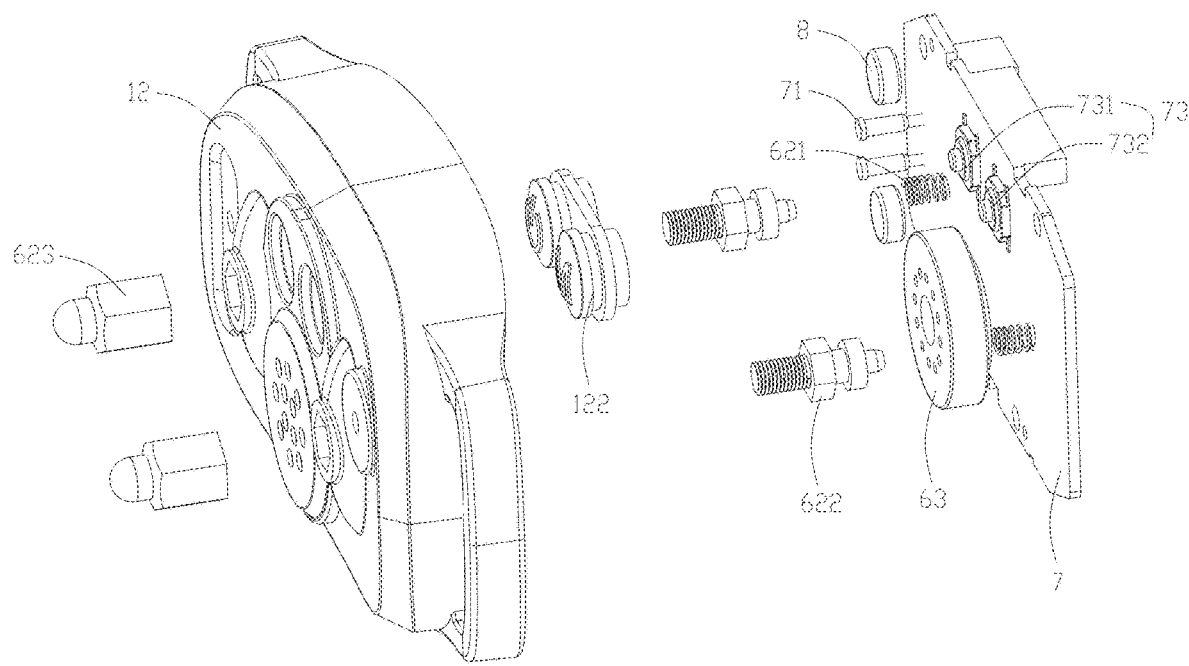
FIG. 5 is a partially exploded diagram of an embodiment of the present disclosure.
Figure 6:
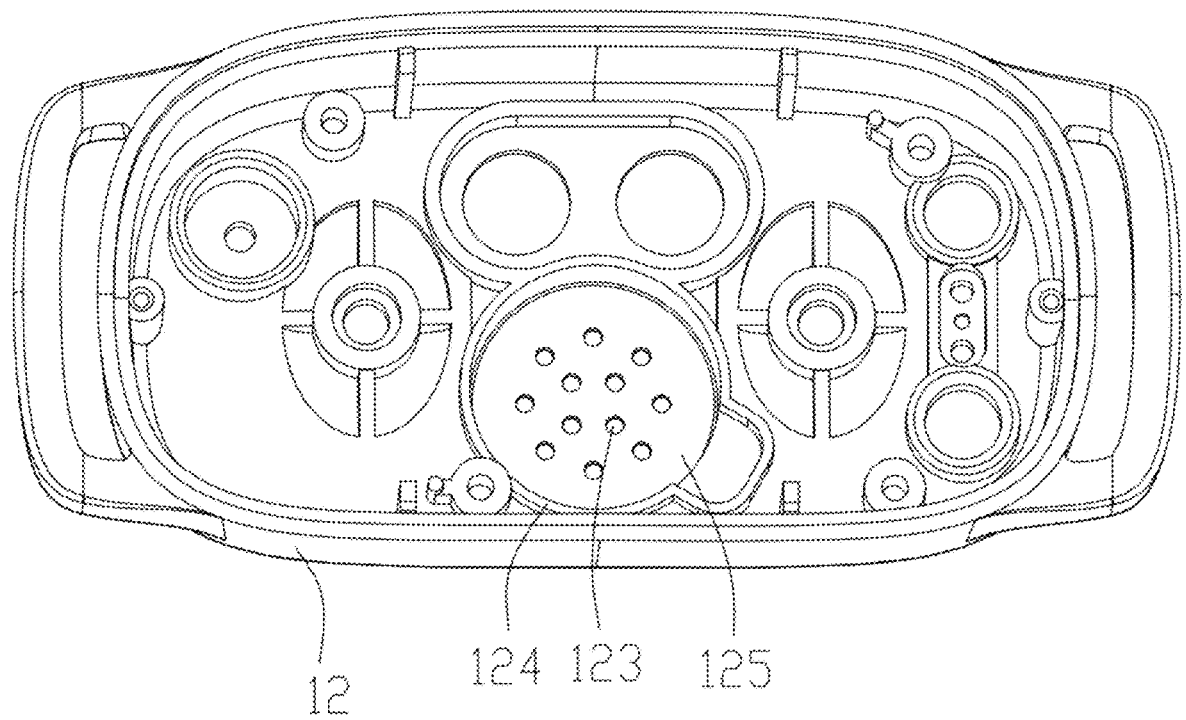
FIG. 6 is a structural diagram of a bottom shell according to an embodiment of the present disclosure.
Figure 7:
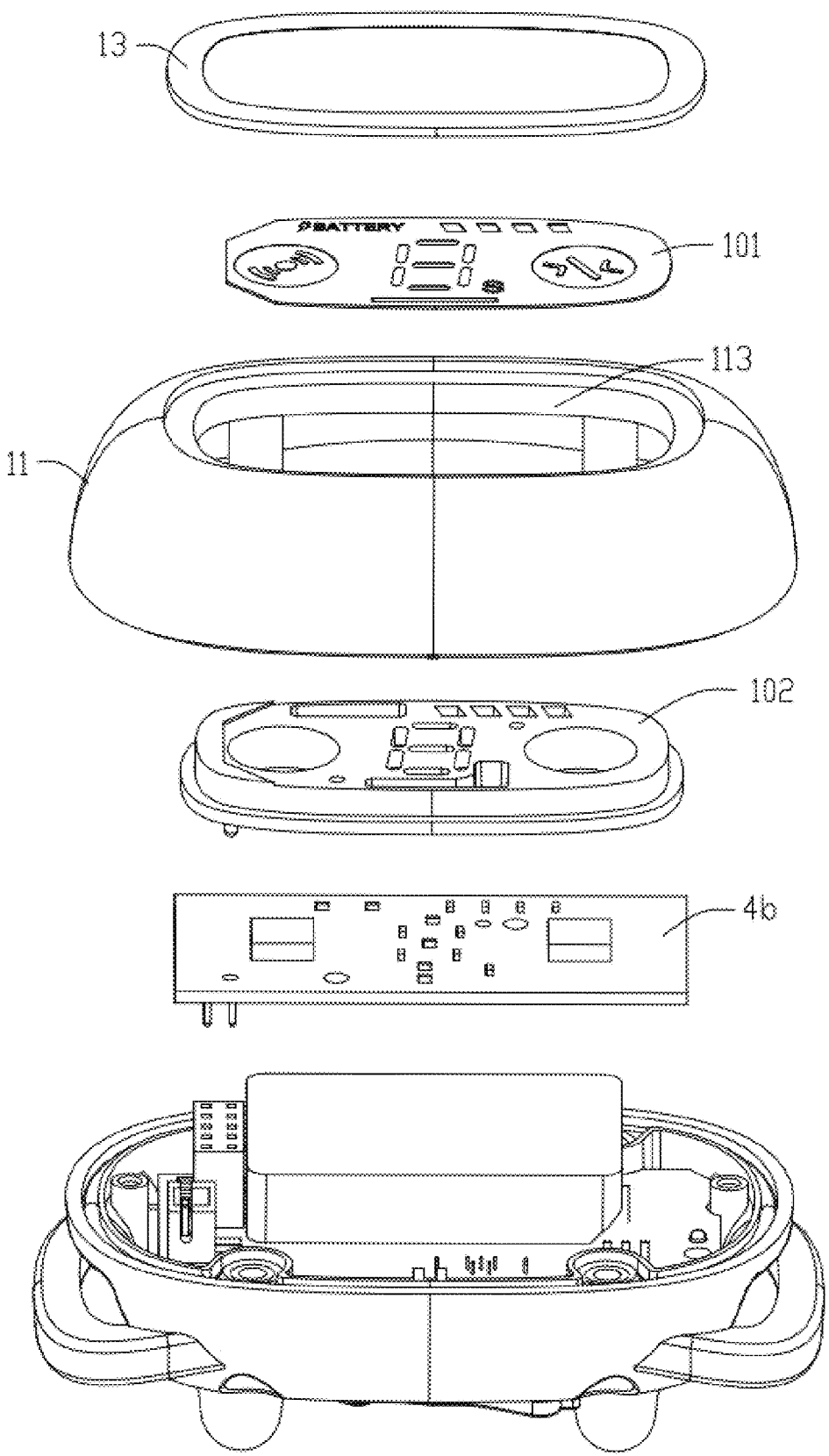
FIG. 7 is a partially exploded diagram of another embodiment of the present disclosure.
Figure 8:
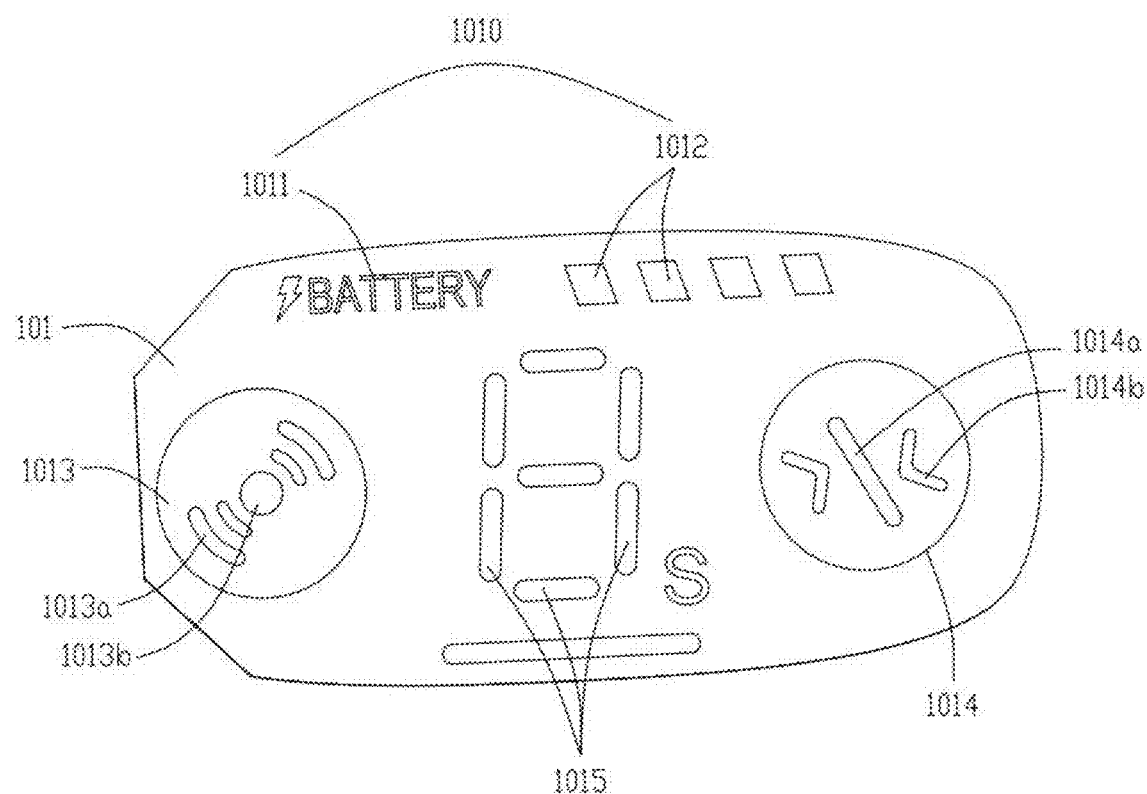
FIG. 8 is a structural diagram of a pattern substrate according to another embodiment of the present disclosure.
Figure 9:
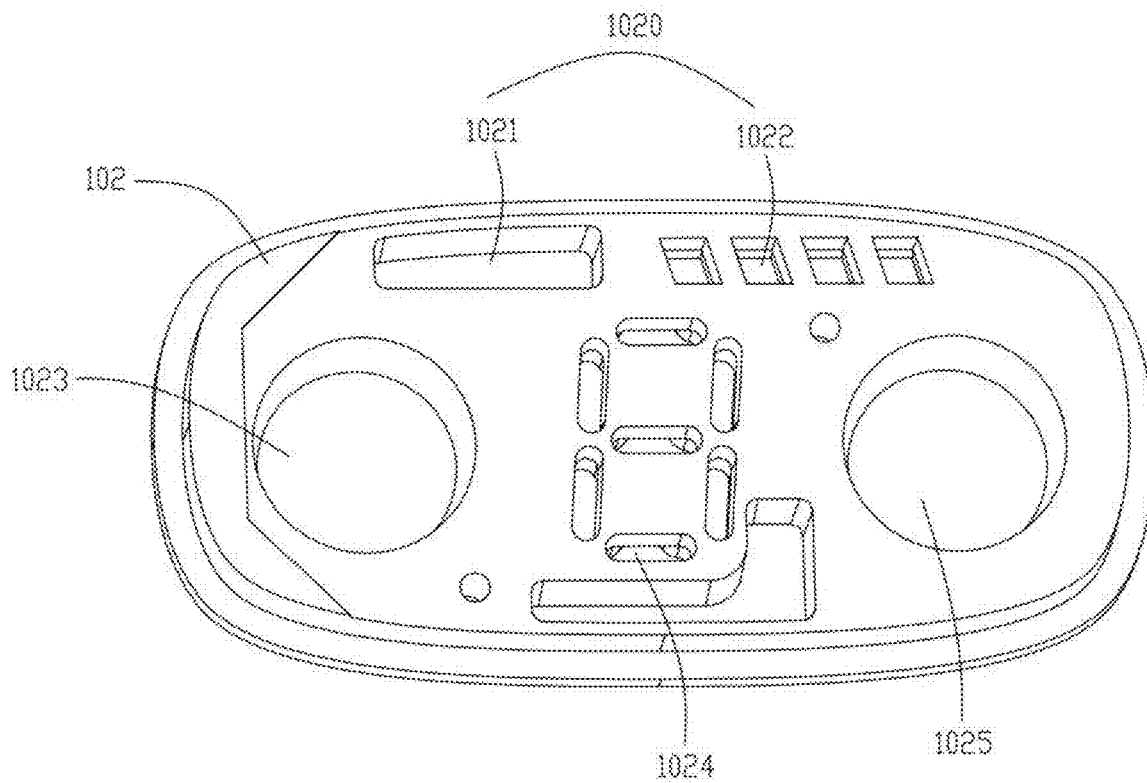
FIG. 9 is a structural diagram of a light guide plate according to another embodiment of the present disclosure.
Figure 10:
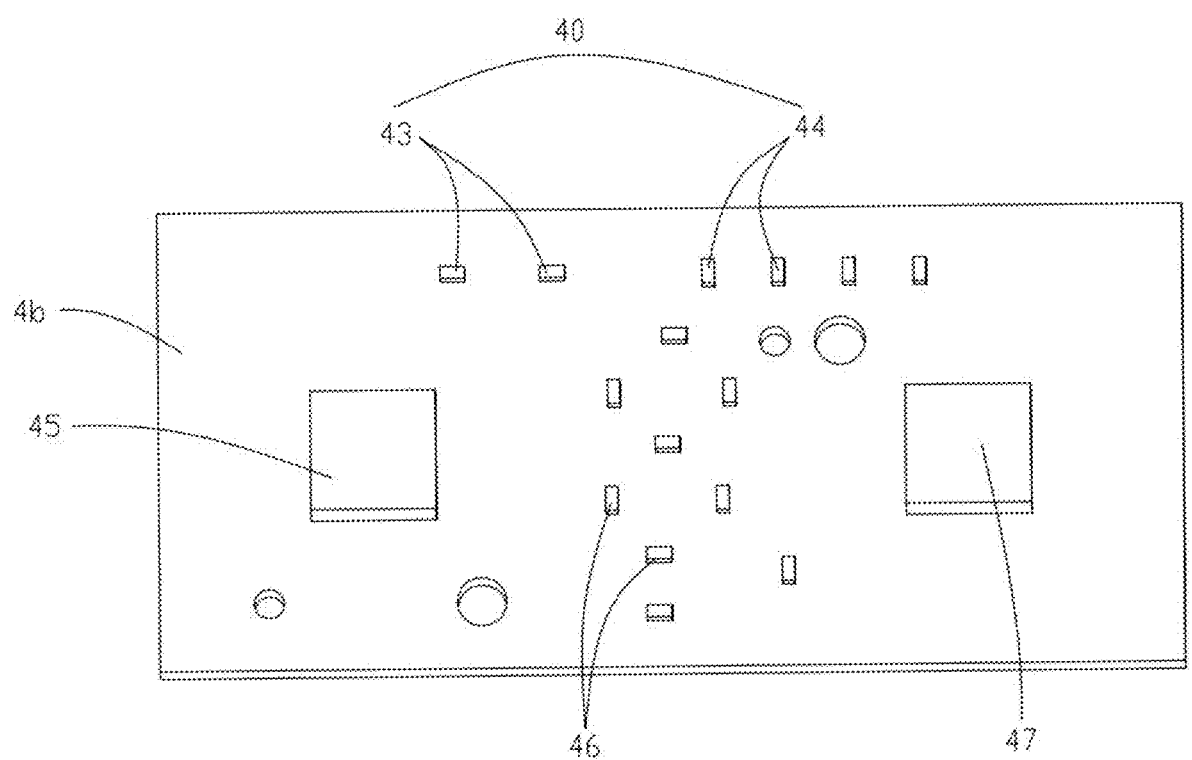
FIG. 10 is a structural diagram of a second circuit board according to another embodiment of the present disclosure.

Specifically, referring to FIG. 5, the electric shock component 6 includes a conductive spring 621 welded on the first circuit board 7, a conductive element 622 resisting against the conductive spring 621, and an electric shock part 623 connected to the conductive element 622; one end of the conductive element 622 extends from the inside of the main body 1 and is placed on the outer side of the main body 1; the conductive element 622 is integrally formed with the main body 1 by injection molding; and the electric shock part 623 is located on the outer side of the main body 1. By the integration of the conductive element 622 and the main body 1, the electrical shock component 6 with the main body 1 to achieve waterproofing. In addition, due to the conductivity of the conductive spring 621, the control module 200 on the first circuit board 7 can be effectively connected to the electric shock part 623. In this way, a voltage output by the control module 200 is output to the electric shock part 623 through the conductive element 622, which can punish the target dog when the electric shock part 623 is in contact with the target dog. The electric shock part 623 is connected to the conductive element 622 through threads, and a user can use electric shock parts 623 with different lengths according to different target dogs. For example, if a target dog has short hairs, a short electric shock part 623 can be used. If a target dog has longer hairs, a long electric shock part 623 can be used, so as to adapt to target dogs with different hair lengths.

In practical application, the dog training module 300 includes a speaker 63 electrically connected to the control module 200; the speaker 63 is located on one side of the first circuit board 7 away from the second circuit board 4a; several voice outlet holes 123 are formed in a position, corresponding to the speaker 63, on the outer side of the main body 1; a second enclosure wall 124 with a first mounting slot 125 is formed at a position, corresponding to the speaker 63, in the main body 1; the speaker 63 is arranged in the first mounting slot 125; and the speaker 63 and a side wall of the first mounting slot 125 are fixed in a gluing manner. In this way, water can be prevented from entering the device through the speaker 63. In addition, when the target dog barks, a voice can be send out through the speaker 63 to play a role of reproaching a pet, so that a barking control effect is achieved.

Figure 4:
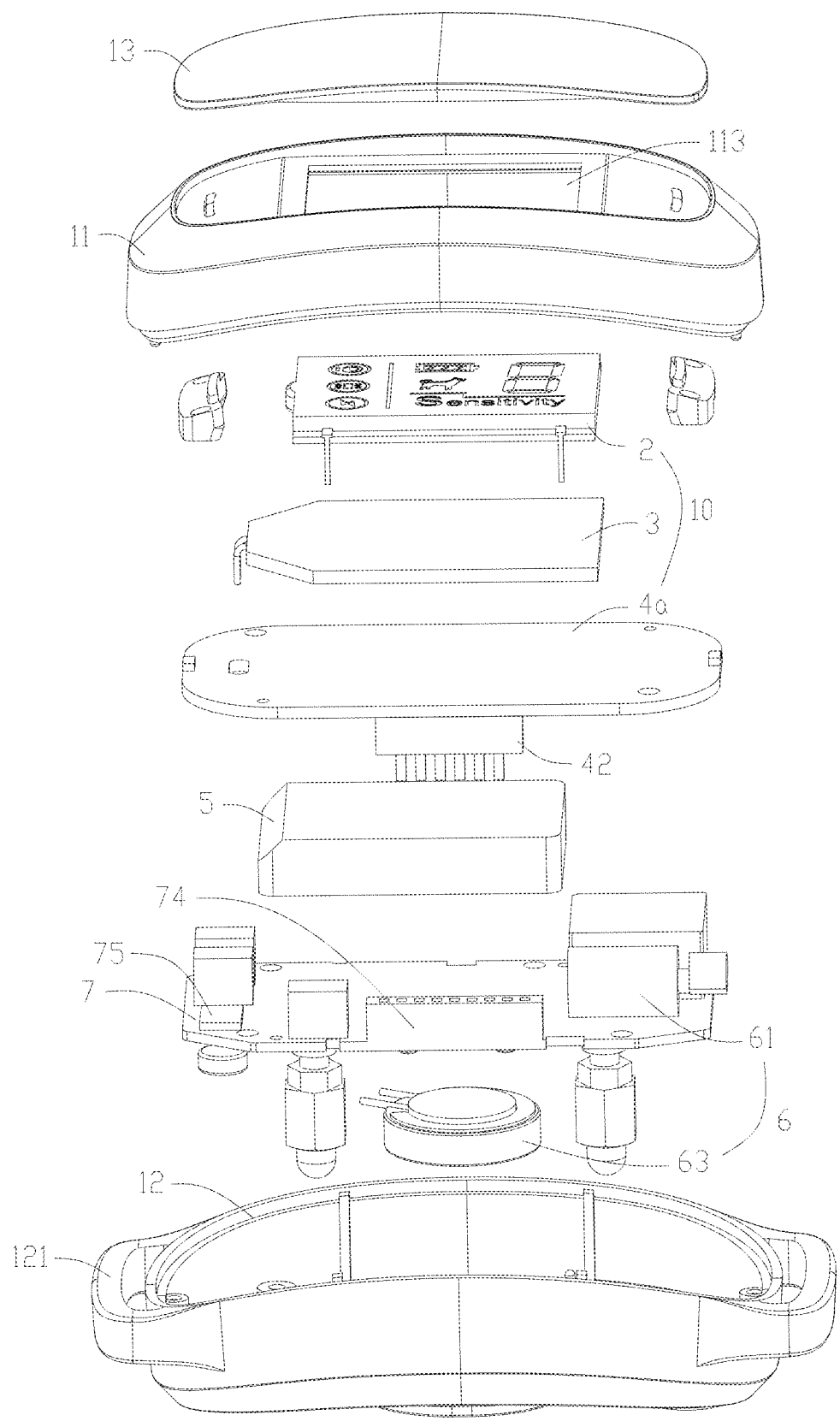
FIG. 4 is an exploded diagram of an embodiment of the present disclosure.

In practical application, referring to FIG. 4, the dog training module 300 includes a vibration motor 61 electrically connected to the control module 200. The vibration motor 61 is located between the second circuit board 4a and the first circuit board 7, and is located on one side of the battery 5. Therefore, when the target dog barks, the vibration motor 61 can be driven to vibrate by a voice of a user, thus making the barking control device in this embodiment vibrate, thereby punishing the pet and achieving a barking control effect.

In an embodiment, the battery 5 is located between the second circuit board 4a and the first circuit board 7. The second circuit board 4a is provided with a first connector 42 on one side close to the first circuit board 7. The first circuit board 7 is provided with a second connector 74 on one side close to the second circuit board 4a. The first connector 42 is connected to the second connector 74, and the first connector 42 is located next to the battery 5. The battery 5 can supply power to the control module 200 on the first circuit board 7, and can supply power to the second circuit board 4a via the connection between the first connector 42 and the second connector 74. Further, due to the connection between the first connector 42 and the second connector 74, the first circuit board 7 may be stably connected to the second circuit board 4a, and the second circuit board 4a may be controlled through the first circuit board 7 to control content displayed by the display module 10.

In an embodiment, referring to FIG. 5, the battery 5 is a rechargeable battery 5. A charging pin 71 that is electrically connected to the control module 200 is arranged on one side of the main body 1 away from the window 113. The main body 1 is provided with a magnetic suction member 8 next to the charging pin 71. The charging pin 71 is connected to an external charger to charge the battery 5 via the control module 200. The charging pin 71 is fixed to the main body 1 by gluing or injection molding to achieve sealing at the charging pin 71 and achieve waterproofing. In other embodiments, the main body 1 may be provided with a charging interface connected to the control module 200, and a rubber plug may be arranged at a position, corresponding to the charging interface, on the main body 1, which can also achieve waterproofing. Furthermore, when the charging interface is connected to a power supply, the battery 5 may be charged through the first circuit board 7.

In other embodiments, the display module 10 may be of another structure. Specifically, referring to FIG. 6 to FIG. 10, the display module 10 includes a second circuit board 4b, a light guide plate 102, and a pattern substrate 101 which are arranged in the main body 1. At least a portion of the light guide plate 102 is arranged in the window 113 and fixed with the window 113 by gluing. The pattern substrate 101 is pasted on one side of the light guide plate 102 close to the window 113; and the second circuit board 4a is arranged on one side of the light guide plate 102 away from the window 113. The pattern substrate 101 is provided with a light-transmittance pattern 1010 configured to transmit light; the light guide plate 102 is provided with a through hole 1020 at a position corresponding to the light-transmittance pattern 1010; the second circuit board 4a is provided with a light source assembly 40 at a position corresponding to the through hole 1020; and after light from the light source assembly 40 passes through the through hole 1020 and the light-transmittance pattern 1010 in sequence, the light-transmittance pattern 1010 is mapped out from a lens 13, so that the corresponding pattern can be displayed, facilitating use. It should be understood that the pattern substrate 101 is made of an opaque material at a position without the light-transmittance pattern 1010, and is made of a light-transmittance material at a position with the transparent pattern 1010. When a light source emits light, a luminous transparent pattern 1010 can be obtained through the through hole 1020 and the light-transmittance pattern 1010, achieving displaying.

In practical application, the display module 10 may be configured to display a battery level of the battery 5. Namely, the light-transmittance pattern 1010 includes a power indicator pattern 1011 configured to transmit light and a battery level pattern 1012 located next to the power indicator pattern 1011 to transmitting light; the through hole 1020 includes a first hole 1021 corresponding to the position of the power indicator pattern 1011 and a second hole 1022 corresponding to the position of the battery level pattern 1012; and the light source assembly 40 includes a first light-emitting body 43 corresponding to the position of the first hole 1021 and a second light-emitting body 44 corresponding to the position of the second hole 1022.

The power indicator pattern 1011 may be an identifier in a shape of "BATTERY" and another pattern. The battery level pattern 1012 may be a rectangle, a square, a circle, or another pattern formed by a plurality of lamps. For example, there may be four rectangles, and there are four second light-emitting bodies 44 and four second holes 1022. When the battery 5 is full, the four second light-emitting bodies 44 emit light, indicating that in terms of a visual effect, all the four rectangular patterns are on. When the battery 5 is half, two second light-emitting bodies 44 emit light, indicating that in terms of a visual effect, two rectangular patterns are on, making it easier for a user to understand.

In practical application, the display module 10 may perform indication when the vibration motor 61 works. Specifically, the light-transmittance pattern 1010 includes a vibration indicator pattern 1013 configured to transmit light; the through hole 1020 includes a third hole 1023 corresponding to the position of the vibration indicator pattern 1013; and the light source assembly 40 includes a third light-emitting body 45 corresponding to the position of the third hole 1023. The vibration indicator pattern 1013 is circular, with an opaque dot 1013b in the middle and a plurality of opaque curved parts 1013a located next to the dot 1013b. Namely, when the vibration motor 61 works and the third light-emitting body 45 emits light, the vibration indicator pattern 1013 can be displayed through the lens 13, playing a role in indicating the work of the vibration motor 61.

In practical application, the display module 10 may perform indication when the electric shock component 6 performs electric shock. Specifically, the light-transmittance pattern 1010 includes an electric shock indicator pattern 1014 configured to transmit light; the through hole 1020 includes a fourth hole 1025 corresponding to the position of the electric shock indicator pattern 1014; and the light source assembly 40 includes a fourth light-emitting body 47 corresponding to the position of the fourth hole 1025. The electric shock indicator pattern 1014 is circular and is provided with an opaque slash part 1014a and broken line parts 1014b located on two sides of the slash part 1014a. Namely, when the fourth light-emitting body 47 emits light during the work of the electric shock component 6, the vibration indicator pattern 1013 can be displayed through the lens 13, playing a role in indicating the work of the electric shock component 6.

In practical application, the display module 10 may be further configured to indicate the electric shock intensity of the electric shock component 6 or the vibration intensity of the vibration motor 61. The light-transmittance pattern 1010 includes an "8"-shaped digital pattern 1015 configured to display a vibration gear; the through hole 1020 includes a fifth hole 1024 corresponding to the position of the digital pattern 1015; and the light source assembly 40 includes a fifth light-emitting body 46 corresponding to the position of the fifth hole 1024. Specifically, there are seven fifth light-emitting bodies 46 and seven fifth holes 1024, which are distributed in an "8" shape. If the electric shock intensity or the vibration intensity has four levels in total, when the electric shock intensity or the vibration intensity is at the third level, digit "3" is displayed.

In practical application, referring to FIG. 5, the first circuit board 7 is provided with a function button 73 on one side away from the second circuit board 4a; the main body 1 is provided with a pressing member 122 at a position corresponding to the function button 73; one end of the pressing member 122 may resist against the function button 73, and the other end extends out to the outer side of the main body 1; and the pressing member 122 is fixed to the main body 1 in a gluing manner on one side close to the window 113, thereby achieving sealing of the function key 73. Specifically, the function button 73 is made of soft rubber to rebound after being pressed, and the function button 73 is fixed on the main body 1 through a buckle. The function button 73 includes a first switch 731 arranged on the circuit board and configured for turning on and turning off, and a second switch 732 configured to switch modes; the first circuit board 7 is configured to receive a signal of the second switch 732 and switch, according to the feedback signal, power output to the electric shock component 6 or motor and/or drive the speaker 63 to work. Namely, the electric shock intensity of the electric shock component 6 or the vibration intensity of the motor 61 may be adjusted through the second switch 732.

In practical application, for the compactness of the structure of this embodiment, there are two electric shock components 6, and the speaker 63 and the two pressing member 122 are both located between the two electric shock components 6. The speaker 63 and the pressing member 122 are distributed at the top and bottom. The charging pin 71 is located on one side of the electric shock component 6 away from the speaker 63.

It should be noted that all directional indications (such as up, down, left, right, front, back . . . ) in the embodiments of the present disclosure are only used to explain a relative positional relationship between components, motion situations, etc. at a certain specific attitude (as shown in the figures). If the specific attitude changes, the directional indication also correspondingly changes.

In addition, the descriptions of "first", "second", etc. in the present disclosure are only used for descriptive purposes, and cannot be understood as indicating or implying its relative importance or implicitly indicating the number of technical features indicated. Therefore, features defined by "first" and "second" can explicitly instruct or impliedly include at least one feature. In addition, "and/or" in the entire text includes three solutions. A and/or B is taken as an example, including technical solution A, technical solution B, and technical solutions that both A and B satisfy. In addition, the technical solutions between the various embodiments can be combined with each other, but it needs be based on what can be achieved by those of ordinary skill in the art. When the combination of the technical solutions is contradictory or cannot be achieved, it should be considered that such a combination of the technical solutions does not exist, and is not within the scope of protection claimed by the present disclosure.

The above descriptions are only preferred embodiments of the present disclosure, and are not intended to limit the patent scope of the present disclosure. Any equivalent structural transformation made by using the content of the specification and the drawings of the present disclosure under the invention idea of the present disclosure, directly or indirectly applied to other related technical fields, shall all be included in the scope of patent protection of the present disclosure.

What is claimed is:

1. A barking control device, comprising:
   a dog training module configured to output stimuli to a target dog;
   a pickup module configured to pick up a sound; and
   a control module electrically connected to the pickup module and the dog training module,
   wherein the control module stores barking control audio data; the control module obtains a voice through the pickup module and matches the voice with the barking control audio data; and when the voice obtained by the pickup module is consistent with the barking control audio data, the control module drives the dog training module;
   wherein the barking control device comprises a main body, a display module, a battery, and a first circuit board; the first circuit board, the pickup module, and the dog training module are all arranged on the main body; the control module is arranged on the first circuit board; the control module is further electrically connected to the display module and the battery;
   the display module is configured to achieve displaying in one or more situations when the barking control device is turned on, when the dog training module outputs stimuli to the target dog, or when the pickup module picks up a voice; a window is formed in a position, corresponding to the display module, on a surface of the main body; and the display module corresponds to the position of the window;
   wherein the display module comprises a second circuit board, a backlight board, and a liquid crystal display screen which are arranged in the main body; the backlight board and the liquid crystal display screen are both welded to one side of the second circuit board close to the window; the control module is electrically connected to the second circuit board; the first circuit board is located on one side of the second circuit board away from the display module; and the liquid crystal display screen is located on one side of the backlight board away from the first circuit board.

2. The barking control device according to claim 1, wherein one piece of barking control audio data is stored.

3. The barking control device according to claim 1, wherein when various pieces of barking control audio data are stored, the control module drives the dog training module when the voice is consistent with one piece of barking control audio data.

4. The barking control device according to claim 1, wherein the control module is further configured to store the voice transmitted by the pickup module and use the voice as barking control audio data.

5. The barking control device according to claim 1, wherein the pickup module is further configured to capture a voice of the target dog, and the control module further stores pet audio data;
   the control module is further configured to match the voice transmitted by the pickup module with the pet audio data; and when the voice transmitted by the pickup module is determined to be the pet audio data, the control module drives the dog training module.

6. The barking control device according to claim 1, further comprising a motion sensing unit, wherein the motion sensing unit is configured to obtain a motion signal of the target dog; and
   the control module is further configured to receive the motion signal of the target dog and drive the dog training module according to the motion signal of the target dog and when it is determined that the voice is the pet audio data.

7. The barking control device according to claim 6, wherein the dog training module comprises a speaker; the speaker is located on one side of the first circuit board away from the second circuit board; several voice outlet holes are formed in a position, corresponding to the speaker, on an outer side of the main body; a second enclosure wall with a first mounting slot is formed at a position, corresponding to the speaker, in the main body; and the speaker is fixed in the first mounting slot in a gluing manner.

8. The barking control device according to claim 6, wherein the dog training module comprises a vibration motor electrically connected to the first circuit board; the vibration motor is arranged in the main body; and the vibration motor is located between the second circuit board and the first circuit board.

9. The barking control device according to claim 1, wherein the main body comprises a surface shell and a bottom shell connected to the surface shell; the window is located on the surface shell; the display module is fixed on the surface shell;
   the dog training module comprises an electric shock component electrically connected to the control module; the electric shock component is located on one side of the first circuit board away from the second circuit board; and at least a portion of the electric shock component extends out to an outer side of the main body.

10. The barking control device according to claim 9, wherein the electric shock component comprises a conductive spring welded on the circuit board, a conductive element resisting against the conductive spring, and an electric shock part connected to the conductive element; one end of the conductive element extends from the inside of the main body and is placed on the outer side of the main body; the conductive element is integrally formed with the main body by injection molding; and the electric shock part is located on the outer side of the main body.

11. The barking control device according to claim 1, wherein the battery is located between the second circuit board and the first circuit board; the second circuit board is provided with a first connector on one side close to the first circuit board; the first circuit board is provided with a second connector on one side close to the second circuit board; the first connector is connected to the second connector; and the first connector is located next to the battery.

12. The barking control device according to claim 1, wherein the battery is located between the second circuit board and the first circuit board; the second circuit board is provided with a first connector on one side close to the first circuit board; the first circuit board is provided with a second connector on one side close to the second circuit board; the first connector is connected to the second connector; and the first connector is located next to the battery.

13. The barking control device according to claim 1, wherein the first circuit board is provided with a function button on one side away from the second circuit board; the main body is provided with a pressing member at a position corresponding to the function button; one end of the pressing member resists against the function button, and the other end extends out to an outer side of the main body; the pressing member is fixed to the main body in a gluing manner on one side close to the window;
the function button comprises a first switch arranged on the first circuit board and configured for turning on and turning off, and a second switch configured to switch modes; the control module is electrically connected to the first switch and the second switch, respectively; and the control module is configured to receive a signal of the second switch and switch modes of the dog training module according to a feedback signal.

14. A barking control device, comprising:
a dog training module configured to output stimuli to a target dog;
a pickup module configured to pick up a sound; and
a control module electrically connected to the pickup module and the dog training module,
wherein the control module stores barking control audio data; the control module obtains a voice through the pickup module and matches the voice with the barking control audio data; and when the voice obtained by the pickup module is consistent with the barking control audio data, the control module drives the dog training module;
wherein the barking control device comprises a main body, a display module, a battery, and a first circuit board; the first circuit board, the pickup module, and the dog training module are all arranged on the main body; the control module is arranged on the first circuit board; the control module is further electrically connected to the display module and the battery;
the display module is configured to achieve displaying in one or more situations when the barking control device is turned on, when the dog training module outputs stimuli to the target dog, or when the pickup module picks up a voice; a window is formed in a position, corresponding to the display module, on a surface of the main body; and the display module corresponds to the position of the window;
wherein the display module comprises a second circuit board, a light guide plate, and a pattern substrate arranged in the main body; at least a portion of the light guide plate is arranged in the window; the pattern substrate is pasted on one side of the light guide plate close to the window; the second circuit board is arranged on one side of the light guide plate away from the window;
the pattern substrate is provided with a light-transmittance pattern configured to transmit light; the light guide plate is provided with a through hole at a position corresponding to the light-transmittance pattern; the second circuit board is provided with a light source assembly at a position corresponding to the through hole; and after light from the light source assembly passes through the through hole and the light-transmittance pattern in sequence, the light-transmittance pattern is mapped out from a lens.

15. The barking control device according to claim 14, wherein the light-transmittance pattern comprises a power indicator pattern configured to transmit light and a battery level pattern located next to the power indicator pattern to transmitting light; the through hole comprises a first hole corresponding to the position of the power indicator pattern and a second hole corresponding to the position of the battery level pattern; and the light source assembly comprises a first light-emitting body corresponding to the position of the first hole and a second light-emitting body corresponding to the position of the second hole.

16. The barking control device according to claim 15, wherein the light-transmittance pattern comprises a vibration indicator pattern configured to transmit light; the through hole comprises a third hole corresponding to the position of the vibration indicator pattern; the light source assembly comprises a third light-emitting body corresponding to the position of the third hole; and the vibration indicator pattern is circular, with an opaque dot in the middle and a plurality of opaque curved parts located next to the dot.

17. The barking control device according to claim 16, wherein the light-transmittance pattern comprises an electric shock indicator pattern configured to transmit light; the through hole comprises a fourth hole corresponding to the position of the electric shock indicator pattern; the light source assembly comprises a fourth light-emitting body corresponding to the position of the fourth hole; and the electric shock indicator pattern is circular and is provided with an opaque slash part and broken line parts located on two sides of the slash part.

18. The barking control device according to claim 17, wherein the light-transmittance pattern comprises an "8"-shaped digital pattern configured to display a vibration gear; the through hole comprises a fifth hole corresponding to the position of the digital pattern; and the light source assembly comprises a fifth light-emitting body corresponding to the position of the fifth hole.

* * * * *